(12) United States Patent
Chan et al.

(10) Patent No.: US 8,643,432 B1
(45) Date of Patent: Feb. 4, 2014

(54) OP-AMP SHARING BY SWAPPING TRANS-CONDUCTANCE CELLS

(75) Inventors: Chi Hong Chan, Hong Kong (HK); Chi Fat Chan, Hong Kong (HK); Gordon Chung, Hong Kong (HK)

(73) Assignee: Hong Kong Applied Science & Technology Research Institute Company Ltd., Hong Kong (HK)

( * ) Notice: Subject to any disclaimer, the term of this patent is extended or adjusted under 35 U.S.C. 154(b) by 41 days.

(21) Appl. No.: 13/560,455

(22) Filed: Jul. 27, 2012

(51) Int. Cl.
*H03F 1/02* (2006.01)
*H03F 3/45* (2006.01)

(52) U.S. Cl.
USPC ............................................. 330/9; 330/253

(58) Field of Classification Search
USPC ...................................... 330/9, 253
See application file for complete search history.

(56) References Cited

U.S. PATENT DOCUMENTS 7,589,660 B1 * 9/2009 Cho ............................... 341/172
8,217,815 B2 * 7/2012 Chen et al. .................... 341/143

2007/0090987 A1  4/2007  Cho et al.
2009/0039956 A1  2/2009  Mo
2011/0148523 A1  6/2011  Deng et al.

FOREIGN PATENT DOCUMENTS

CN          1697321 A     11/2005
CN        101814920 A      8/2010

* cited by examiner

*Primary Examiner* — Steven J Mottola
(74) *Attorney, Agent, or Firm* — Stuart T. Auvinen; gPatent LLC.

(57) ABSTRACT

A two-stage op amp has a transconductance cell in a second stage modified to match a transconductance cell in a first stage. A transconductance swap network is inserted between transconductance cells and trans-impedance cells, such as current-steering networks, current mirrors, or drivers connected to the transconductance cells. The transconductance swap network directly connects the first transconductance cell to the first stage trans-impedance cell during a second clock phase, but crosses-over the first transconductance cell to the second-stage trans-impedance cell during a first clock phase. A first switched-capacitor network drives the gates of differential transistors in the first transconductance cell by alternately sampling an input and feedback, and equalizing to reset inputs. A second first switched-capacitor network drives differential transistors in the second transconductance cell, but during opposite clock phases. Two independent inputs are sampled by the switched-capacitor networks and alternately amplified by swapping connections within the shared op amp.

20 Claims, 10 Drawing Sheets

US 8,643,432 B1

OP-AMP SHARING BY SWAPPING TRANS-CONDUCTANCE CELLS

FIELD OF THE INVENTION

This invention relates to op amp circuits, and more particularly to shared dual-channel op amps with switched-capacitor networks.

BACKGROUND OF THE INVENTION

Operational Amplifiers (Op Amps) are widely used. A switched-capacitor network may be placed on the input to the Op Amp and clocked with non-overlapping two-phase clocks. During one phase the Op Amp is reset, clearing any stored error charge. The input is sampled and stored on a capacitor. In the other phase, the stored input is amplified by the Op Amp. The Op Amp's output is fed back to the switched capacitor network to store an error charge.

The Op Amp is actually amplifying for only one of the two phases. Since the Op Amp is not amplifying for the other phase, the Op Amp is basically performing useful work for only half of the time.

Various techniques have been devised to use this wasted time by sharing an Op Amp. A multiplexer may be placed on the input to the Op Amp, allowing two capacitor networks to input to the same Op Amp. However, a memory effect may occur on parasitic capacitances causing the two input signals to have a dependence on one another, rather than being truly independent of each other. Reset circuitry may be added to reduce this memory effect, but the reset circuitry may require additional time to operate, reducing the operating frequency of the Op Amp. The reset circuitry also adds to the size, area, cost, and parasitic load. A second pair of differential input transistors may be added, but the differential input transistors are large in size to reduce noise and increase gain. Thus adding a second differential input pair is especially costly.

What is desired is a shared Op Amp using switched capacitor networks. A shared Op Amp is desired due to the lower power dissipation, area, but without an excessive area overhead or speed loss due to the sharing circuits. A more elegant shared Op Amp is desirable.

DETAILED DESCRIPTION

The present invention relates to an improvement in shared Op Amps. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
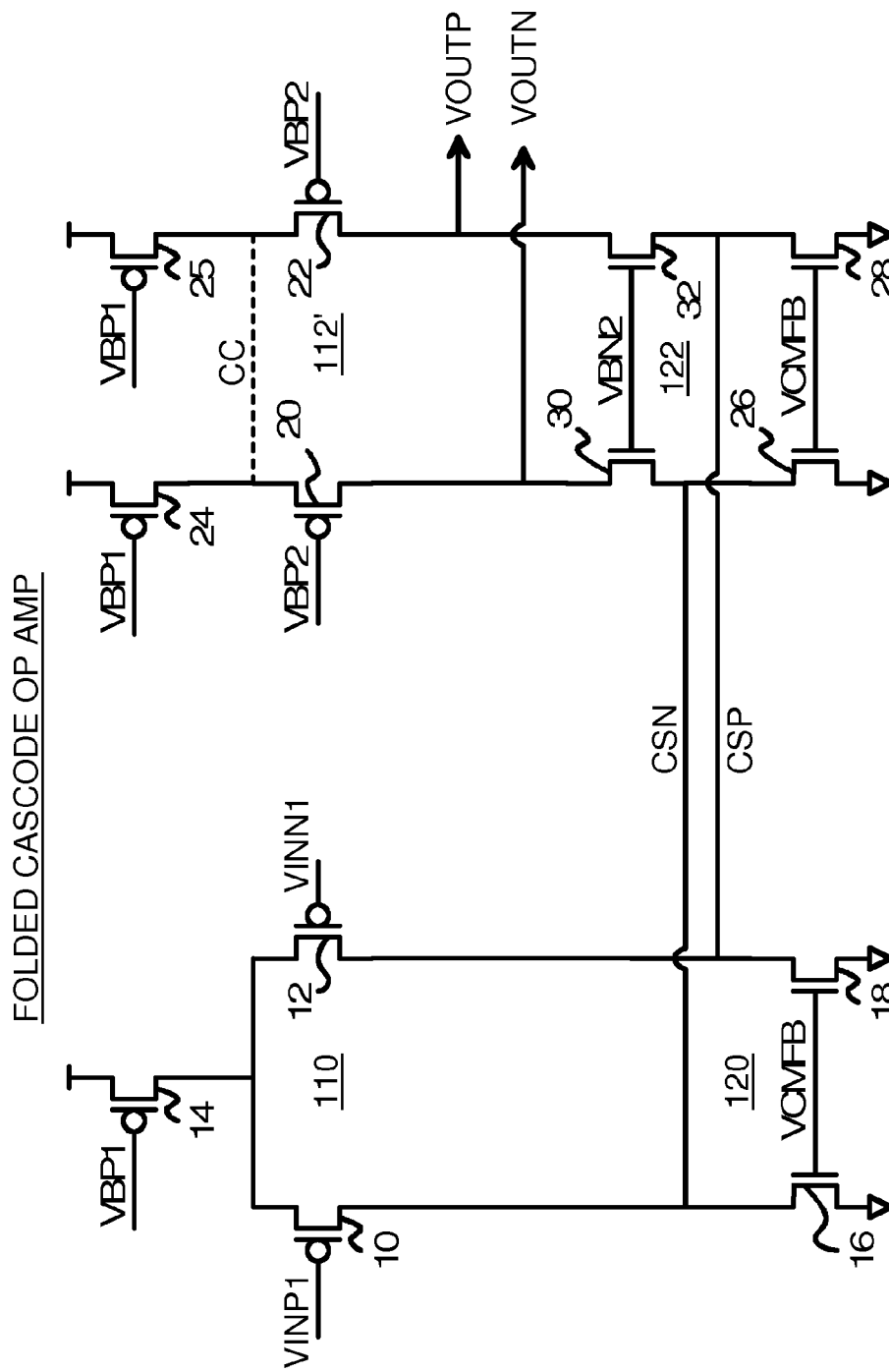
FIG. 1 shows a schematic of a folded cascode op amp.

FIG. 1 shows a schematic of a folded cascode op amp. The op amp has a first stage and a second stage, with the differential output VOUTP, VOUTN generated by the second stage. An input is stored and applied to the gates of differential transistors 10, 12 in the first stage, and a bias voltage VBP2 is applied to the gates of input transistors 20, 22 in the second stage.

The first stage has first transconductance cell 110 with tail current transistor 14 providing a current to the sources of differential transistors 10, 12, which steer the current among the two branches of current-steering input stage 120. Current steering transistors 16, 18 receive a common-mode feedback voltage VCMFB on their gates, as do current steering transistors 26, 28 in current-steering output stage 122. The drains of current steering transistors 16, 26 are connected together by node CSN, while drains of current steering transistors 18, 28 are connected together by node CSP, thus connecting the first and second stages of the op amp.

Current-steering output stage 122 also has cascode transistors 30, 32 in series before the outputs VOUTN, VOUTP. A bias voltage VBN2 is applied to the gates of cascode transistors 30, 32, while another bias voltage VBP1 is applied to the gates of tail current transistor 14, and to source current transistors 24, 25 in second transconductance cell 112.

The second stage of the op amp is a cascode stage, so the two branches are not connected together. The current from source current transistor 24 only flows through input transistor 20, while the current from source current transistor 25 only flows through input transistor 22.

The inventors have noticed that if the drains of input transistors 20, 22 were connected together, such as by dashed node CC, then source current transistors 24, 25 would be identical and could be a single transistor similar to tail current transistor 14 in the first stage.

Figure 2:
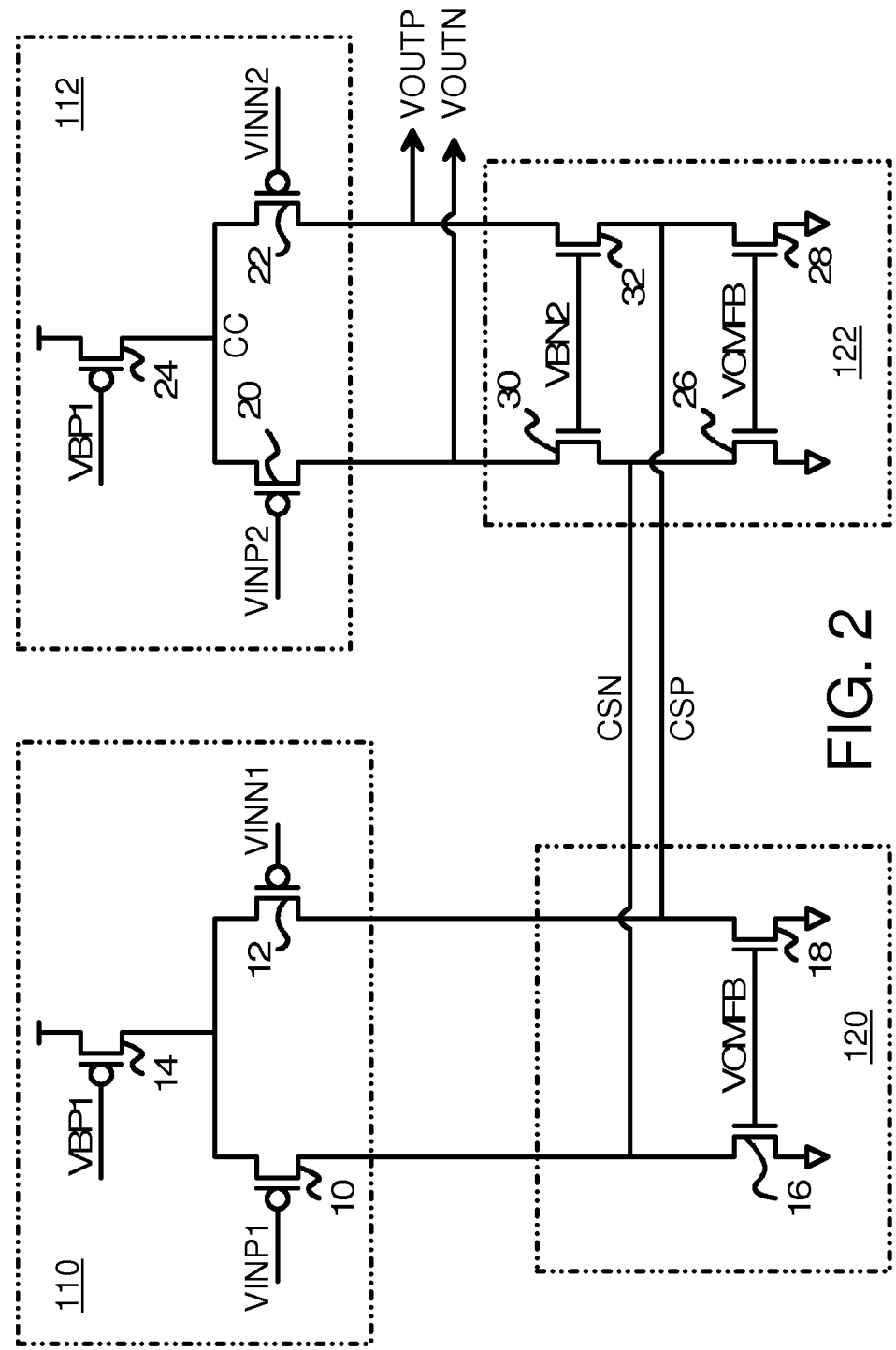
FIG. 2 shows an op amp having the cascode source current transistors shorted together.

FIG. 2 shows an op amp having the cascode source current transistors shorted together. Node CC in second transconductance cell 112 connects the sources of input transistors 20, 22 together with the drain of source current transistor 24. Thus second transconductance cell 112 has the same transistor structure as first transconductance cell 110 when node CC is added to the folded cascode op amp of FIG. 1. A cascode structure is still provided for the pull-down of outputs VOUTP, VOUTN since current-steering output stage 122 still has separate branches, but second transconductance cell 112 no longer has a cascode current source. Thus performance of the modified op amp should be impacted only minimally by the addition of node CC.

The inventors further realize that since first transconductance cell 110 and second transconductance cell 112 are identical, they may be swapped or interchanged. In particular, first transconductance cell 110 could connect to current-steering input stage 120 during one clock phase, and could be connected to current-steering output stage 122 during a second clock phase.

Likewise, second transconductance cell 112 could be connected to current-steering output stage 122 during a first clock phase, and connected to current-steering input stage 120 during the second clock phase.

Thus the addition of node CC allows first transconductance cell 110 and second transconductance cell 112 to be time multiplexed to current-steering input stage 120 and to current-steering output stage 122.

Figure 3:
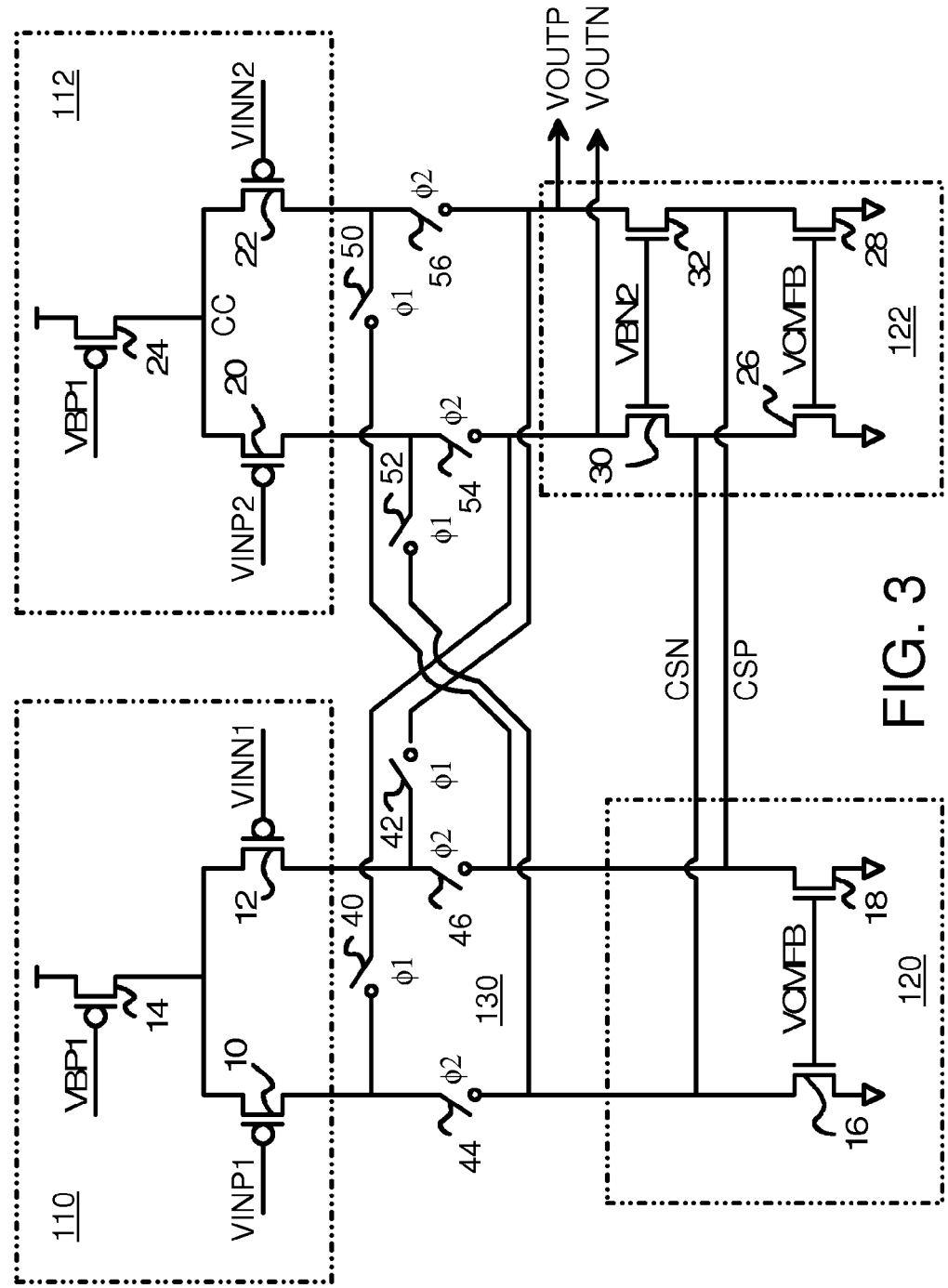
FIG. 3 shows a dual-channel op amp with a swap switch network between transconductance cells and current-steering stages.

FIG. 3 shows a dual-channel op amp with a swap switch network between transconductance cells and current-steering stages. Transconductance swap network 130 is inserted between transconductance cells 110, 112 and current-steering input stage 120 and current-steering output stage 122. A two-phase non-overlapping clock, $\phi 1$, $\phi 2$ controls transconductance swap network 130. Transconductance swap network 130 crosses over or swaps the connection during first phase $\phi 1$, but connects directly or straight through during second phase $\phi 2$.

Transconductance swap network 130 connects first transconductance cell 110 to current-steering output stage 122 and connects second transconductance cell 112 to current-steering input stage 120 during a first clock phase $\phi 1$. Transconductance swap network 130 connects first transconductance cell 110 to current-steering input stage 120 and connects second transconductance cell 112 to current-steering output stage 122 during a second clock phase $\phi 2$.

During the first phase $\phi 1$, switch 40 closes and switch 44 opens to connect differential transistor 10 in the first stage to output VOUTN and cascode transistor 30 in the second stage. Likewise, switch 42 closes and switch 46 opens to connect differential transistor 12 in the first stage to output VOUTP and cascode transistor 32 in the second stage. First transconductance cell 110 thus drives current-steering output stage 122.

Also during the first phase $\phi 1$, switch 52 closes and switch 54 opens to connect differential transistor 20 in the second stage to current steering transistor 16 in the first stage. Likewise, switch 50 closes and switch 56 opens to connect differential transistor 22 in the second stage to current steering transistor 18 in the first stage. Second transconductance cell 112 thus drives current-steering input stage 120.

During the second phase $\phi 2$, switch 44 closes and switch 40 opens to connect differential transistor 10 in the first stage to current steering transistor 16 in the first stage. Likewise, switch 46 closes and switch 42 opens to connect differential transistor 12 in the first stage to current steering transistor 18 in the first stage. First transconductance cell 110 thus drives current-steering input stage 120.

Also during the second phase $\phi 2$, switch 54 closes and switch 52 opens to connect differential transistor 20 in the second stage to output VOUTN and cascode transistor 30 in the second stage Likewise, switch 56 closes and switch 50 opens to connect differential transistor 22 in the second stage to output VOUTP and cascode transistor 32 in the second stage. Second transconductance cell 112 thus drives current-steering output stage 122 during $\phi 2$.

Swapping occurs during $\phi 1$, while direct connection occurs during $\phi 2$.

Figure 4:
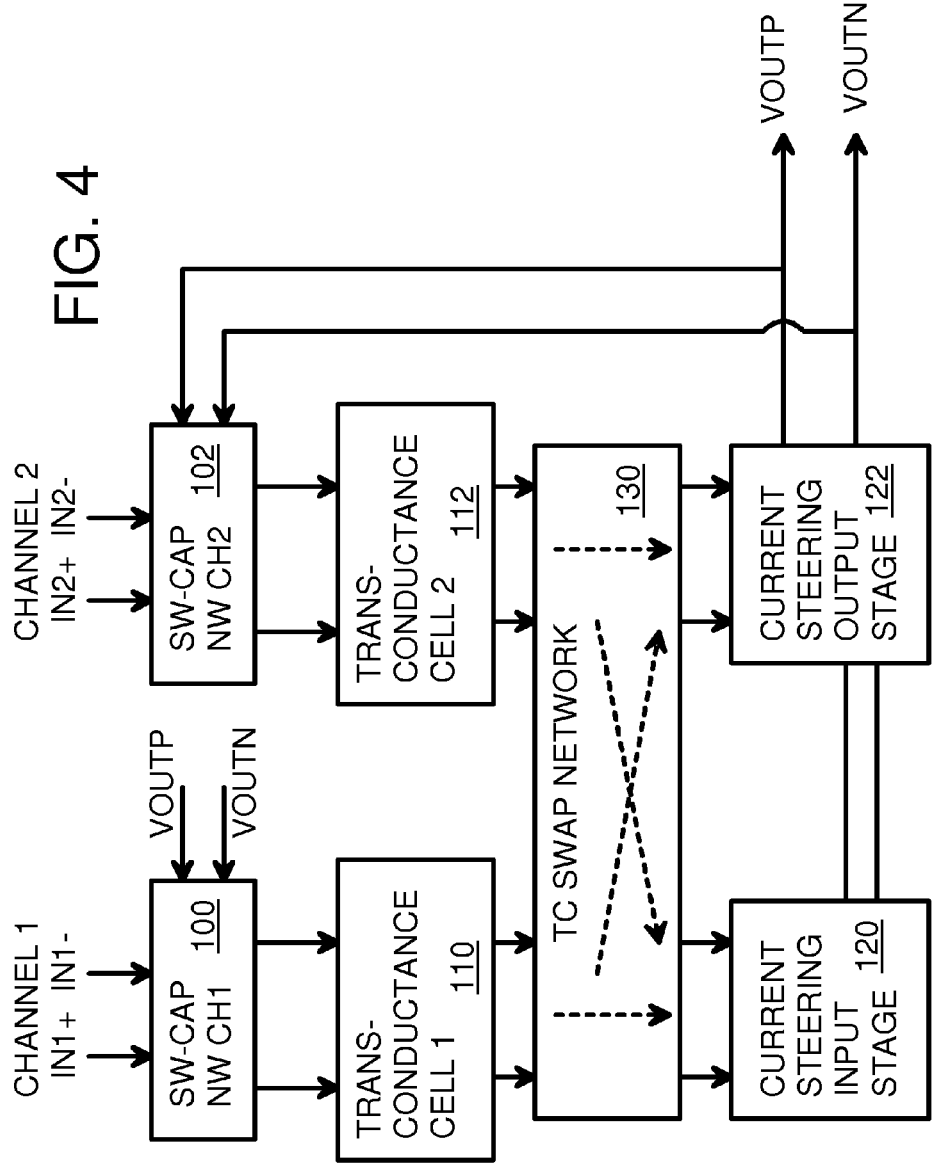
FIG. 4 is a block diagram of a dual-channel shared op amp with dual switched capacitor networks on the inputs.

FIG. 4 is a block diagram of a dual-channel shared op amp with dual switched capacitor networks on the inputs. Transconductance swap network 130 is inserted between first transconductance cell 110 and current-steering input stage 120 in the first stage, and between second transconductance cell 112 and current-steering output stage 122 in the second stage of the op amp. Transconductance swap network 130 crosses first transconductance cell 110 over to current-steering output stage 122, and also crosses second transconductance cell 112 over to current-steering input stage 120 during $\phi 1$.

An output VOUTP, VOUTN is generated by current-steering output stage 122 and is also fed back to switched-capacitor networks 100, 102. First switched-capacitor network 100 is for channel 1, and receives a first differential input IN1+, IN1−. First switched-capacitor network 100 samples IN1+, IN1−, stores change on a capacitor, and switches the stored charge onto the gates of differential transistors 10, 12 in first transconductance cell 110. An error charge is also stored on a capacitor in first switched-capacitor network 100 in response to the feedback from output VOUTP, VOUTN.

A second differential input, IN2+, 1N2−, is sampled by second switched-capacitor network 102, which also stores an error charge and drives the gates of input transistors 20, 22 in second transconductance cell 112. The output VOUTP-VOUTN, toggles between an output signal generated from IN1 and an output signal generated from IN2. The two channels of inputs N1, 1N2 can be separate, independent signals that are not dependent on each other. Thus a single op amp can be shared by two channels of independent signals.

Figure 5:
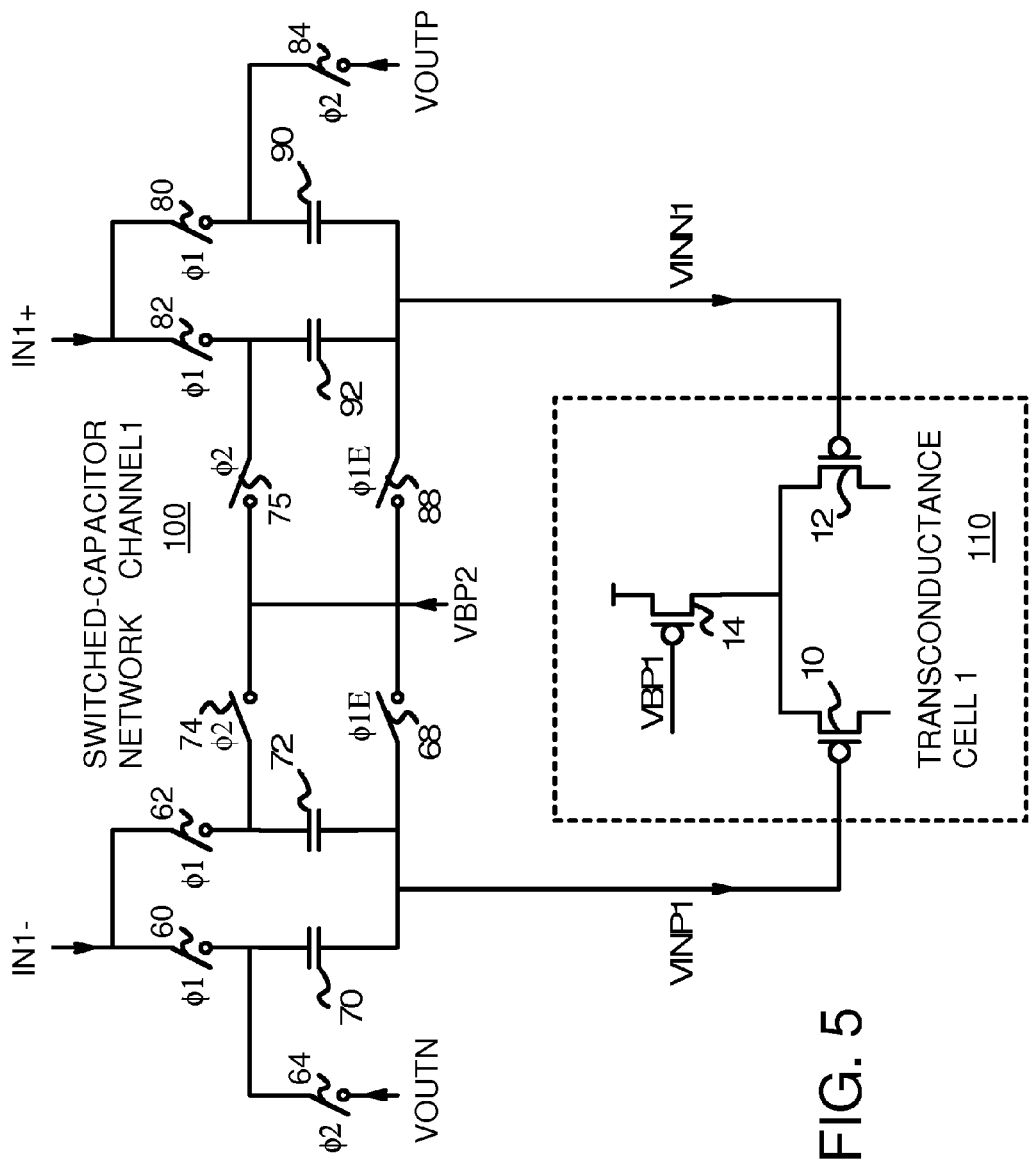
FIG. 5 is a schematic of a first switched-capacitor network for a first-channel input.

FIG. 5 is a schematic of a first switched-capacitor network for a first-channel input. First switched-capacitor network 100 samples a first channel differential input IN1−, IN1+ onto feedback capacitors 70, 90 and onto sampling capacitors 72, 92 during first phase $\phi 1$ when switches 60, 80 and 62, 82 close. The other plates of capacitors 70, 72, 90, 92 are equalized to bias voltage VBP2 when switches 68, 88 are closed by an equalizing phase clock $\phi 1E$, which ends slightly before $\phi 1$. Thus during most of $\phi 1$, the gates of differential transistors 10, 12 are both driven with a same bias voltage VBP2, and first transconductance cell 110 acts as a current source and does not amplify any input signal. First transconductance cell 110 is used as a current source to current-steering output stage 122 the second stage during phase 1 since transconductance swap network 130 swaps during phase 1.

During the second phase, $\phi 2$ is active and $\phi 1$ is off, opening switches 60, 62, 80, 82 to end sampling, and opening equalizing switches 68, 88. Switches 74, 75 close to drive bias voltage VBP2 to the front sides of sampling capacitors 72, 92, driving the sampled charge onto inputs VINP1, VINN1. The sampled charge is then amplified by differential transistors 10, 12, which are connected to current-steering input stage 120 in the first stage during phase 2. The amplified signal then connects from the first stage to the second stage through nodes CSN, CSP, and is buffered by current-steering output stage 122 in the cascode second stage to generate the outputs VOUTP, VOUTN.

Feedback switches 64, 84 also close during phase 2, feeding the outputs VOUTP, VOUTN back to feedback capacitors 70, 90 Any error in the op amp is stored on feedback capacitors 70, 90. Any memory effect may be cancelled by storing error charges and by equalizing.

Figure 6:
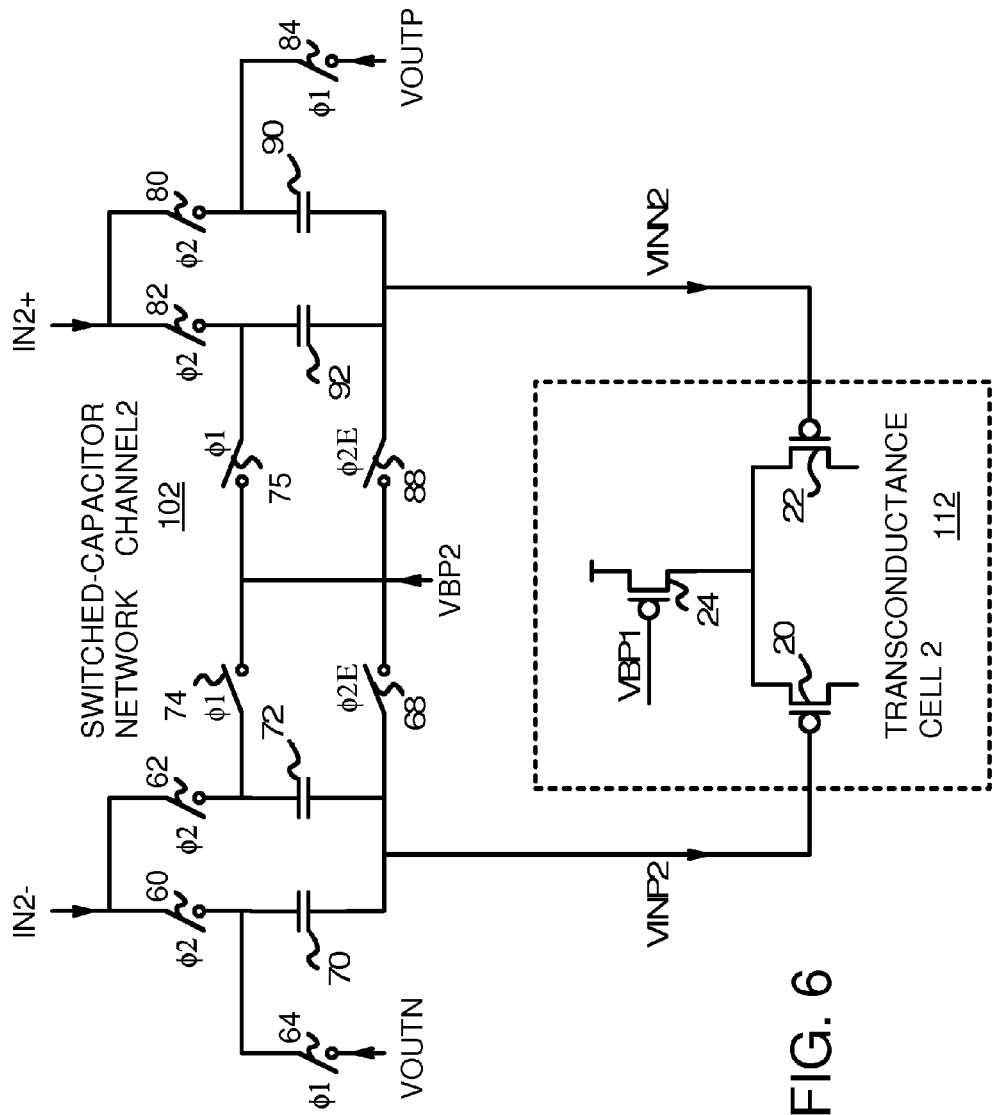
FIG. 6 is a schematic of a second switched-capacitor network for a second-channel input.

FIG. 6 is a schematic of a second switched-capacitor network for a second-channel input. The clock phases $\phi 1$, $\phi 2$ are swapped for second switched-capacitor network 102 compared to first switched-capacitor network 100 to alternate sampling and amplification using the shared op amp.

Second switched-capacitor network 102 samples a second channel differential input IN2−, IN2+ onto feedback capacitors 70, 90 and onto sampling capacitors 72, 92 during second phase $\phi 2$ when switches 60, 80 and 62, 82 close. The other plates of capacitors 70, 72, 90, 92 are equalized to bias voltage VBP2 when switches 68, 88 are closed by an equalizing phase clock $\phi 2E$, which ends slightly before $\phi 2$. Thus during most of $\phi 2$, the gates of differential transistors 20, 22 are both driven with a same bias voltage VBP2, and second transconductance cell 112 acts as a current source and does not amplify any input signal. Second transconductance cell 112 is used as a current source to current-steering output stage 122 the second stage during phase 2 since transconductance swap network 130 does not swap but makes a direct connection during phase 2.

During the first phase, φ1 is active and φ2 is off, opening switches 60, 62, 80, 82 to end sampling, and opening equalizing switches 68, 88. Switches 74, 75 close to drive bias voltage VBP2 to the front sides of sampling capacitors 72, 92, driving the sampled charge onto inputs VINP2, VINN2. The sampled charge is then amplified by differential transistors 20, 22, which are connected to current-steering input stage 120 in the first stage during phase 1. The amplified signal then connects from the first stage to the second stage through nodes CSN, CSP, and is buffered by current-steering output stage 122 in the cascode second stage to generate the outputs VOUTP, VOUTN.

Feedback switches 64, 84 also close during phase 1, feeding the outputs VOUTP, VOUTN back to feedback capacitors 70, 90 Any error in the op amp is stored on feedback capacitors 70, 90.

Figure 7:
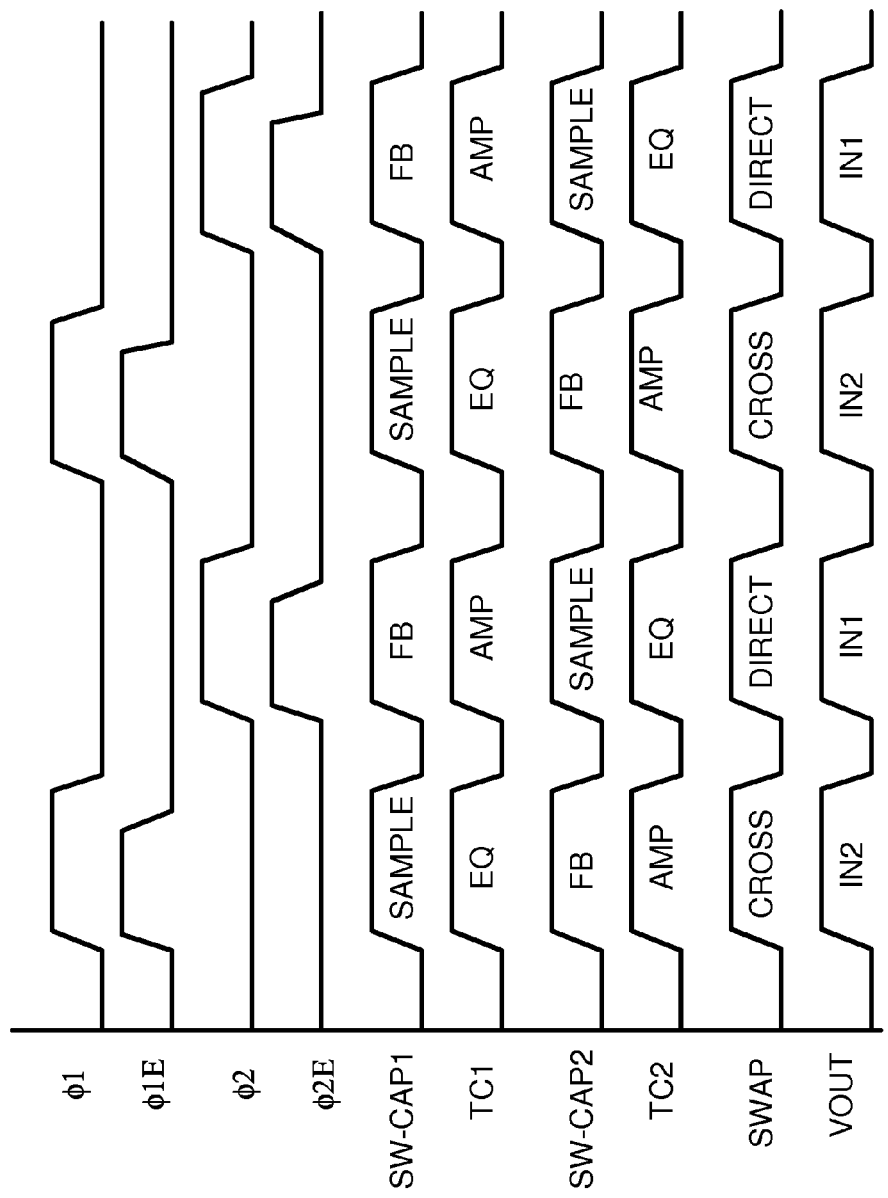
FIG. 7 is a timing diagram showing alternating sampling and amplification of two independent inputs by one shared op amp during two clock phases.

FIG. 7 is a timing diagram showing alternating sampling and amplification of two independent inputs by one shared op amp during two clock phases. Phase 1 clock φ1 and phase 2 clock φ2 are non-overlapping clocks. Equalizing clock 41E is in phase with φ1, but ends early. Likewise, φ2E also ends early, to reduce noise from switching.

First switched-capacitor network 100 SW-CAP1 samples its input during phase 1 and stores an op-amp error charge during phase 2. First transconductance cell 110, TC1, is always driven by first switched-capacitor network 100 and receives equalized inputs during phase 1 but amplifies the sampled inputs during phase 2.

Second switched-capacitor network 102 SW-CAP2 samples its input during phase 2 and stores an op-amp error charge during phase 1. Second transconductance cell 112, TC2, is always driven by second switched-capacitor network 102 and receives equalized inputs during phase 2 but amplifies the sampled inputs during phase 1. Thus the first and second switched networks and transconductance cells perform alternate operations during the two phases.

Transconductance swap network 130 (SWAP) swaps or crosses-over the first-stage transconductance cell 110 to the second-stage current-steering output stage 122 during phase 1, but directly connects during phase 2. The output VOUT is generated by the second stage, and is thus generated from the second-channel input IN2 during phase 1, when crossover occurs, but is generated from the first-channel input IN1 during phase 2, when no crossover occurs.

The output, VOUT, alternates between an amplification of IN1 and an amplification of IN2 during the two clock phases. A single op amp is used to amplify two independent inputs, saving power, area, and cost.

Figure 8:
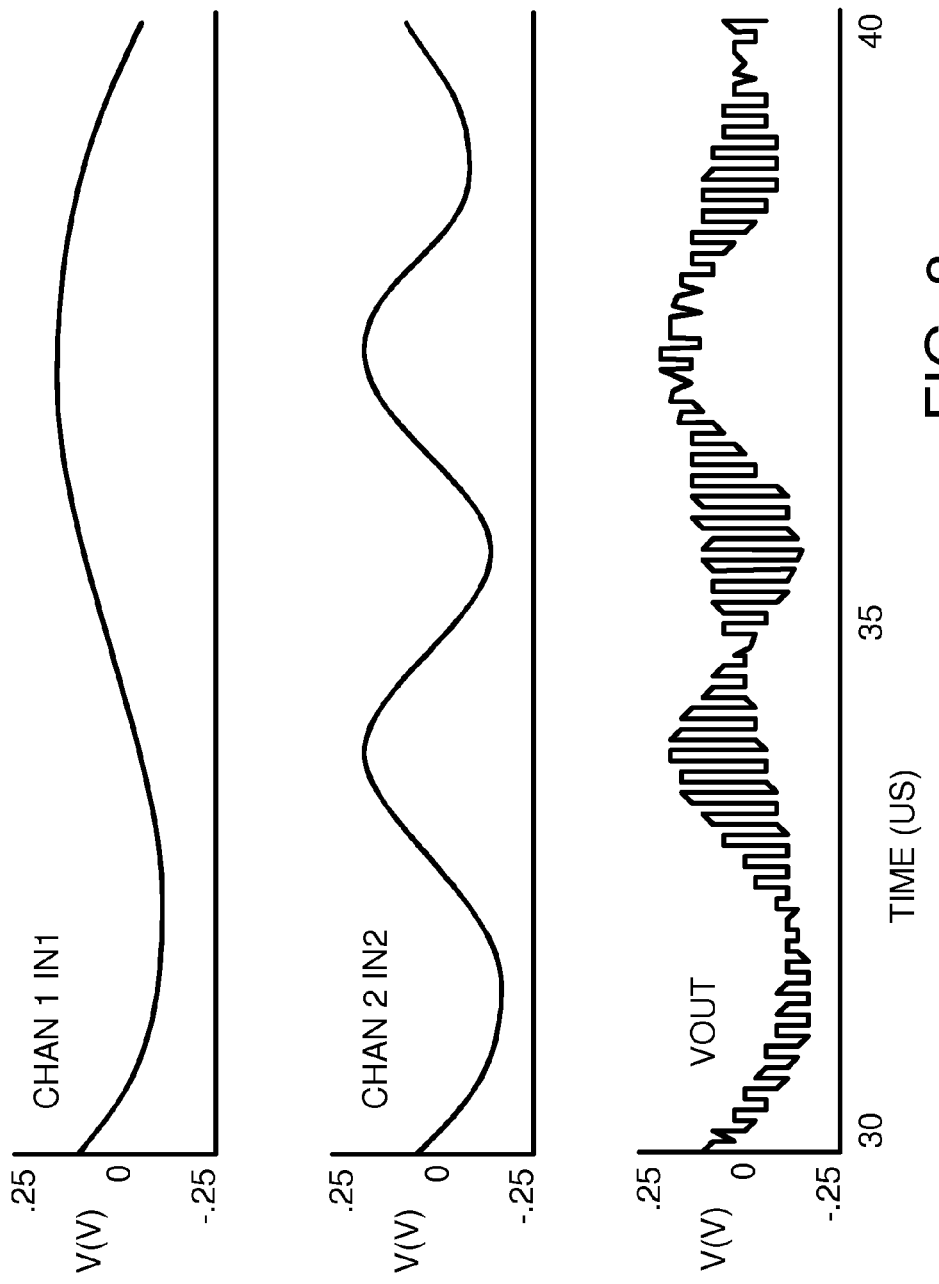
FIG. 8 is a waveform of two independent inputs and an alternating output from a shared op amp.

FIG. 8 is a waveform of two independent inputs and an alternating output from a shared op amp. The channel 1 input has a longer period than the channel 2 input in this simulation example. The shared op amp output VOUT is an envelope of pulses that have a period equal to the period of the two-phase clocks φ1, φ2. When IN1 has a higher voltage than IN2, the top of the envelope corresponds to the amplified IN1, while the bottom of the envelope corresponds to the amplified IN2. A demultiplexer or chopper on the output VOUT may be used to separate the two signal components, and filters used to smooth the separated outputs to recover the amplified independent inputs.

Figure 9:
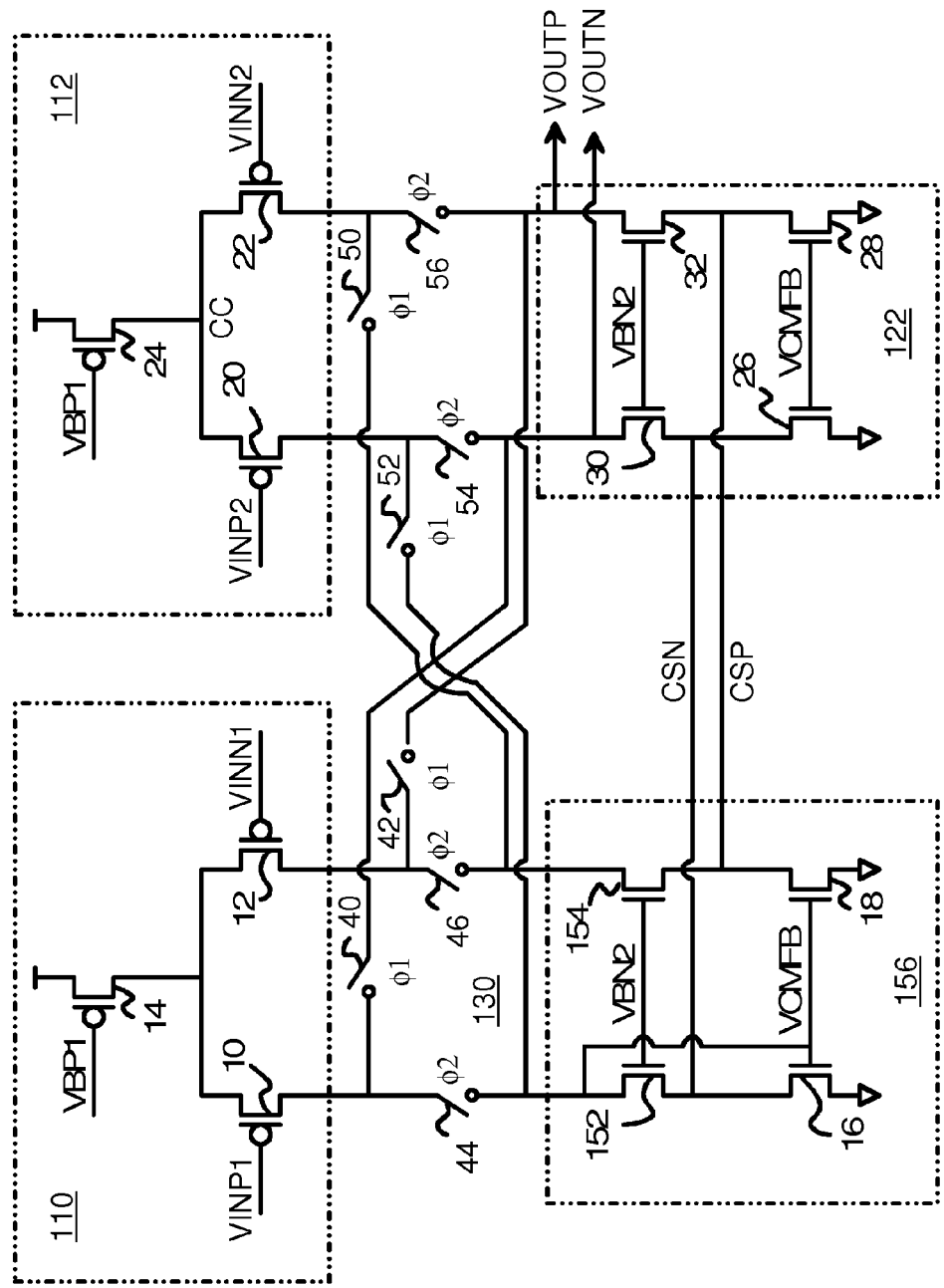
FIG. 9 is an alternative shared op amp using a current mirror.

FIG. 9 is an alternative shared op amp using a current mirror. Current-steering input stage 120 is replaced with current mirror input stage 156. The common-mode feedback voltage VCMFB is generated within current mirror input stage 156 by connecting the gates of current steering transistors 16, 18 to the drain of transistor 152, which is inserted in series between current steering transistor 16 and transconductance swap network 130. Bias voltage VBN2 is applied to the gate of transistor 152 and also to the gate of transistor 154, which is in series between current steering transistor 18 and transconductance swap network 130.

Figure 10:
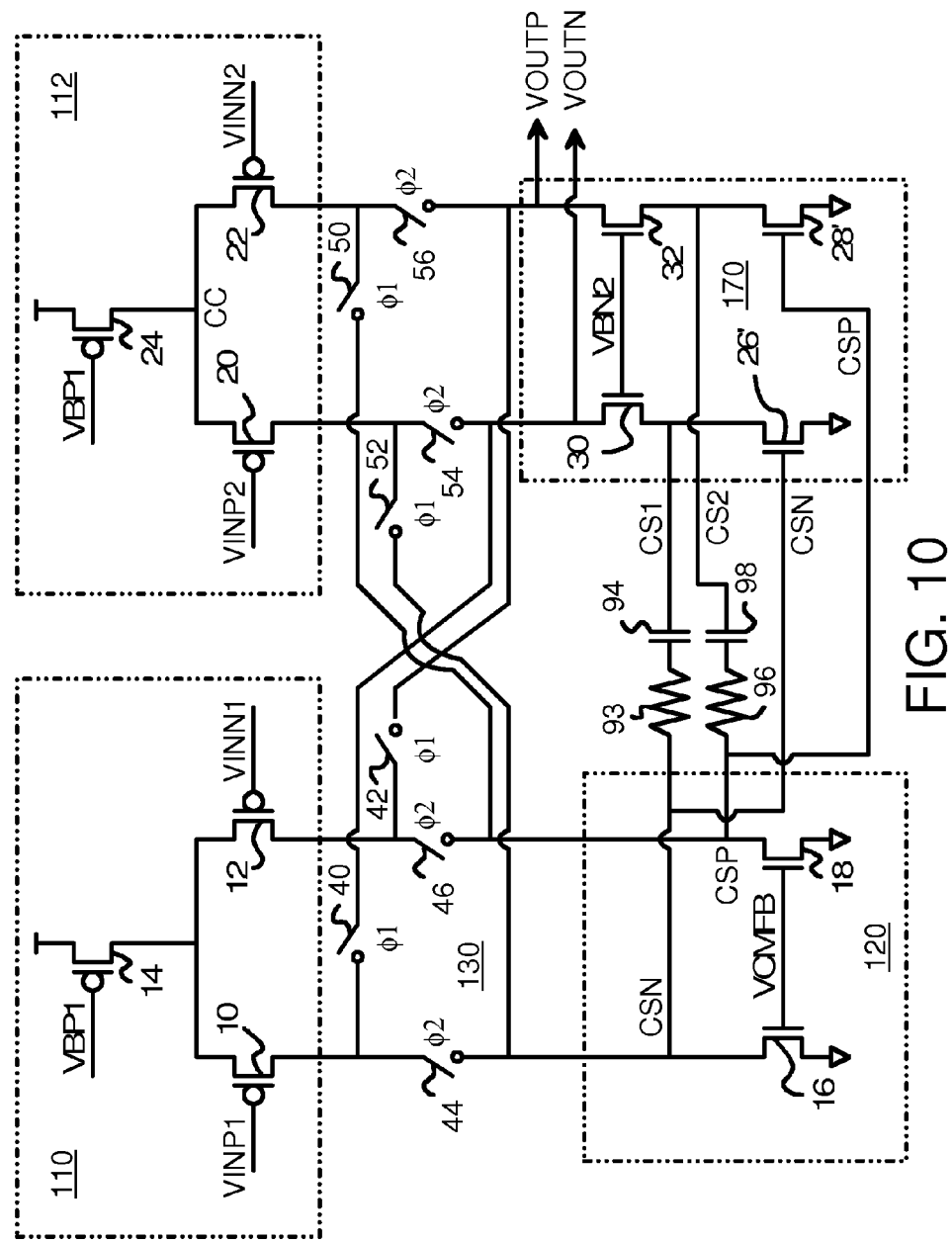
FIG. 10 is an alternative shared two-stage op amp.

FIG. 10 is an alternative shared two-stage op amp. In this alternative, current-steering output stage 122 is replaced with second-stage driver 170. Rather than be driven by the common-mode feedback voltage VCMFB, the gate of driver transistor 26' is driven by node CSN generated by the drain of current steering transistor 16 in current-steering input stage 120 Likewise, the gate of driver transistor 28' is driven by node CSP generated by the drain of current steering transistor 18 in the first stage.

A filter of resistor 93 and capacitor 94 in series is inserted between nodes CSN and CS1 to connect to the drain of driver transistor 26' Likewise, a filter of resistor 96 and capacitor 98 in series is inserted between nodes CSP and CS2 to connect to the drain of driver transistor 28'. These filters provide D.C. isolation between the first and second stages while passing higher-speed A.C. signals. The filter forms a frequency compensation network that improves circuit stability during feedback.

The current-steering portion of each stage may be more generically called a trans-impedance cell, since impedance loads are provided for the differential transistors in the transconductance cells. Many types of trans-impedance cells may be used, such as current-steering (as in FIG. 3), current-mirroring (as in FIG. 9), and driver second stages (such as in FIG. 10), with or without filters between the stages. Other kinds of trans-impedance cells may be substituted and many variations in circuit arrangements are possible.

ALTERNATE EMBODIMENTS

Several other embodiments are contemplated by the inventors. For example while two stages have been shown, more stages may be used with alternating inputs, such as 4 stages, 8 stages, etc. A multi-stage op amp may have four stages as an example. The first and second transconductance cells may be matched in transistor connection arrangement but have different size transistors, or may also have identical transistor sizes.

The shared op amp may be used in various applications, such as analog-to-digital converters (ADC's), switched capacitor filters, switched-capacitor gain stages, transceiver baseband filters and ADC's, digital imaging devices, transducers for sensors such as temperature or pressure sensors. Power and area may be reduced when multiple channels need to be processed, since the number of op amps may be reduced by half.

Speed is improved since a separate reset phase is not needed, and reset circuitry is not added. One op amp input pair is reset and equalized while the other op amp input pair is amplifying. Error charges are removed to minimize any memory effect.

The shared op amp method may be extended to other op amp topologies, such as folded cascode, current mirror, two-stage op amps with a differential pair, folded cascode, or current mirror as the first stage, or multiple stages with a differential pair, folded cascode, or current mirror as the first stage. While two stages have been shown, more stages could be added, and buffering, level shifting, clocking, power-down, or other stages may be added. While op amps with p-channel differential transistors have been shown, p-channel and n-channel transistors may be swapped and the circuit flipped over to use n-channel differential transistors, tail transistors, and p-channel current steering. Bias voltages may be adjusted as well.

Switches may be implemented as n-channel or p-channel transistors, or as transmission gates with parallel p-channel and n-channel transistors.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Input resistors could be added to VINP, VINN, or other inputs, or more complex input filters used. Inversions may be added by swapping true and complement connections, such as by swapping VIN+, VIN−, or by swapping true and complement current-steering connections, or output feedback.

Inversions may be added, or extra buffering. The final sizes of transistors and capacitors may be selected after circuit simulation or field testing. Metal-mask options or other programmable components may be used to select the final capacitor, resistor, or transistor sizes. Capacitors or transistors may be connected together in parallel to create larger capacitors or transistors that have the same fringing or perimeter effects across several capacitor or transistor sizes. While differential signals for a differential op amp have been shown, single-ended op amps could also use the swapping techniques.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto.

We claim:

1. A dual-channel switched-capacitor amplifier comprising:
    a first input;
    a second input;
    a first switched-capacitor network having a first sampling capacitor to sample the first input, and a first feedback capacitor to sample an output to generate a first sampled input;
    a first transconductance cell having a first differential transistor with a gate connected to the first sampled input generated by the first switched-capacitor network, the first transconductance cell also having a first tail transistor that generates a first tail current to the first differential transistor;
    a second switched-capacitor network having a second sampling capacitor to sample the second input, and a second feedback capacitor to sample the output to generate a second sampled input;
    a second transconductance cell having a second differential transistor with a gate connected to the second sampled input generated by the second switched-capacitor network, the second transconductance cell also having a second tail transistor that generates a second tail current to the second differential transistor;
    a first-stage trans-impedance cell for receiving a first-stage current and for generating coupling signals to a second stage;
    a second-stage trans-impedance cell for receiving a second-stage current and for receiving the coupling signals from the first-stage trans-impedance cell, the second-stage trans-impedance cell generating the output; and
    a transconductance swap network for connecting the first transconductance cell to the first-stage trans-impedance cell and for connecting the second transconductance cell to the second-stage trans-impedance cell during a direct connection, and for connecting the first transconductance cell to the second-stage trans-impedance cell and for connecting the second transconductance cell to the first-stage trans-impedance cell during a swap connection,
whereby connections between transconductance and trans-impedance cells are swapped by the transconductance swap network.

2. The dual-channel switched-capacitor amplifier of claim 1 wherein the first differential transistor generates a first differential current;
    wherein the second differential transistor generates a second differential current;
    wherein the transconductance swap network switches the first differential current to the first-stage trans-impedance cell as the first-stage current and switches the second differential current to the second-stage trans-impedance cell as the second-stage current during the direct connection;
    wherein the transconductance swap network switches the second differential current to the first-stage trans-impedance cell as the first-stage current and switches the first differential current to the second-stage trans-impedance cell as the second-stage current during the swap connection,
whereby currents from transconductance cells are swapped by the transconductance swap network.

3. The dual-channel switched-capacitor amplifier of claim 1 wherein the first differential transistor comprises a first true differential transistor that generates a first true differential current and a first complement differential transistor that generates a first complement differential current;

wherein the first sampling capacitor further comprises a first true sampling capacitor connected to a first complement input signal of the first input by a first true sampling switch and a first complement sampling capacitor connected to a first true input signal of the first input by a first complement sampling switch;

wherein the first feedback capacitor further comprises a first true feedback capacitor connected to a complement output of the output by a first true feedback switch, and a first complement feedback capacitor connected to a true output of the output by a first complement feedback switch;

wherein the second differential transistor comprises a second true differential transistor that generates a second true differential current and a second complement differential transistor that generates a second complement differential current;

wherein the second sampling capacitor further comprises a second true sampling capacitor connected to a second complement input signal of the second input by a second true sampling switch and a second complement sampling capacitor connected to a second true input signal of the second input by a second complement sampling switch;

wherein the second feedback capacitor further comprises a second true feedback capacitor connected to the complement output of the output by a second true feedback switch, and a second complement feedback capacitor connected to the true output of the output by a second complement feedback switch;

whereby transconductance cells and switched-capacitor networks are fully differential.

4. The dual-channel switched-capacitor amplifier of claim 3 further comprising:

a first phase clock activated to signal the swap connection of the transconductance swap network;

a second phase clock activated to signal the direct connection of the transconductance swap network;

wherein the first phase clock and the second phase clock are applied to control the transconductance swap network, wherein the swap connection and the direct connection are alternated by the first and second phase clocks.

5. The dual-channel switched-capacitor amplifier of claim 4 wherein the first true sampling switch, the first complement sampling switch, the second true feedback switch, and the second complement feedback switch are all closed in response to the first phase clock;

wherein the second true sampling switch, the second complement sampling switch, the first true feedback switch, and the first complement feedback switch are all closed in response to the second phase clock.

6. The dual-channel switched-capacitor amplifier of claim 5 wherein the first switched-capacitor network further comprises:

a first true feedback sampling switch connected between the first complement input signal and the first true feedback capacitor in response to the first phase clock;

a first true equalizing switch connected between an equalizing voltage and a gate of the first true differential transistor;

wherein the gate of the first true differential transistor is also connected to the first true sampling capacitor and to the first true feedback capacitor;

a first complement feedback sampling switch connected between the first true input signal and the first complement feedback capacitor in response to the first phase clock;

a first complement equalizing switch connected between the equalizing voltage and a gate of the first complement differential transistor;

wherein the gate of the first complement differential transistor is also connected to the first complement sampling capacitor and to the first complement feedback capacitor;

a first backside driving switch coupled between the equalizing voltage and the first true sampling capacitor, and coupled between the equalizing voltage and the first complement sampling capacitor, the first backside driving switch closed in response to the second phase clock;

wherein the second switched-capacitor network further comprises:

a second true feedback sampling switch connected between the second complement input signal and the second true feedback capacitor in response to the second phase clock;

a second true equalizing switch connected between an equalizing voltage and a gate of the second true differential transistor;

wherein the gate of the second true differential transistor is also connected to the second true sampling capacitor and to the second true feedback capacitor;

a second complement feedback sampling switch connected between the second true input signal and the second complement feedback capacitor in response to the second phase clock;

a second complement equalizing switch connected between the equalizing voltage and a gate of the second complement differential transistor;

wherein the gate of the second complement differential transistor is also connected to the second complement sampling capacitor and to the second complement feedback capacitor; and a second backside driving switch coupled between the equalizing voltage and the second true sampling capacitor, and coupled between the equalizing voltage and the second complement sampling capacitor, the second backside driving switch closed in response to the first phase clock.

7. The dual-channel switched-capacitor amplifier of claim 6 wherein the first true equalizing switch and the first complement equalizing switch are closed in response to an equalizing first phase clock, the equalizing first phase clock ending before the first phase clock wherein switch noise is accumulated on other capacitances in the first switched-capacitor network;

wherein the second true equalizing switch and the second complement equalizing switch are closed in response to a an equalizing second phase clock, the equalizing second phase clock ending before the second phase clock wherein switch noise is accumulated on other capacitances in the second switched-capacitor network.

8. The dual-channel switched-capacitor amplifier of claim 6 wherein the first-stage current comprises a first-stage true current and a first-stage complement current;

wherein the second-stage current comprises a second-stage true current and a second-stage complement current;

wherein the transconductance swap network further comprises:
a first true direct switch, closed by the second phase clock, for connecting the first true differential current to the first-stage true current;
a first complement direct switch, closed by the second phase clock, for connecting the first complement differential current to the first-stage complement current;
a first true crossover switch, closed by the first phase clock, for connecting the first true differential current to the second-stage true current;
a first complement crossover switch, closed by the first phase clock, for connecting the first complement differential current to the second-stage complement current;
a second true direct switch, closed by the second phase clock, for connecting the second true differential current to the second-stage true current;
a second complement direct switch, closed by the second phase clock, for connecting the second complement differential current to the second-stage complement current;
a second true crossover switch, closed by the first phase clock, for connecting the second true differential current to the first-stage true current; and
a second complement crossover switch, closed by the first phase clock, for connecting the second complement differential current to the first-stage complement current.

9. The dual-channel switched-capacitor amplifier of claim 8 wherein the true output is generated by the second-stage complement current;
wherein the complement output is generated by the second-stage true current.

10. The dual-channel switched-capacitor amplifier of claim 8 wherein the first-stage trans-impedance cell is a current mirror or a current-steering stage generating the coupling signals and wherein the second-stage trans-impedance cell is a cascode stage or a driver controlled by the coupling signals.

11. An alternating-output op amp comprising:
a first tail transistor connected to a first tail node;
a first true differential transistor connected between the first tail node and a first true switch input and having a first true gate;
a first complement differential transistor connected between the first tail node and a first complement switch input and having a first complement gate;
a first true trans-impedance transistor, connected between a first true switch output and a supply node and generating a true connection voltage;
a first complement trans-impedance transistor, connected between a first complement switch output and the supply node and generating a complement connection voltage;
a first true direct switch for connecting the first true switch input to the first true switch output when a second phase clock is active;
a first complement direct switch for connecting the first complement switch input to the first complement switch output when the second phase clock is active;
a first true crossover switch for connecting the first true switch input to a second true switch output when a first phase clock is active;
a first complement crossover switch for connecting the first complement switch input to a second complement switch output when the first phase clock is active;
a second tail transistor connected to a second tail node;
a second true differential transistor connected between the second tail node and a second true switch input and having a second true gate;
a second complement differential transistor connected between the second tail node and a second complement switch input and having a second complement gate;
a second true direct switch for connecting the second true switch input to the second true switch output when the second phase clock is active;
a second complement direct switch for connecting the second complement switch input to the second complement switch output when the second phase clock is active;
a second true crossover switch for connecting the second true switch input to the first true switch output when the first phase clock is active;
a second complement crossover switch for connecting the second complement switch input to the first complement switch output when the first phase clock is active;
a second true output transistor, connected between the second true switch output and a second-stage true node, wherein the second true switch output is a complement output;
a second complement output transistor, connected between the second complement switch output and a second-stage complement node, wherein the second complement switch output is a true output;
a second true trans-impedance transistor, connected between the second-stage true node and the supply node; and
a second complement trans-impedance transistor, connected between the second-stage complement node and the supply node.

12. The alternating-output op amp of claim 11 further comprising:
a first true switched-capacitor network having a first true switched capacitor that is coupled between a first complement input and the first true gate when the first phase clock is active, and having a first true feedback switched capacitor that is coupled between the complement output and the first true gate when the second phase clock is active;
a first complement switched-capacitor network having a first complement switched capacitor that is coupled between a first true input and the first complement gate when the first phase clock is active, and having a first complement feedback switched capacitor that is coupled between the true output and the first complement gate when the second phase clock is active;
a second true switched-capacitor network having a second true switched capacitor that is coupled between a second complement input and the second true gate when the second phase clock is active, and having a second true feedback switched capacitor that is coupled between the complement output and the second true gate when the first phase clock is active; and
a second complement switched-capacitor network having a second complement switched capacitor that is coupled between a second true input and the second complement gate when the second phase clock is active, and having a second complement feedback switched capacitor that is coupled between the true output and the second complement gate when the first phase clock is active.

13. The alternating-output op amp of claim 11 further comprising:
a first switched-capacitor network comprising:
a first true sampling switch coupled between a first complement input and a first true sampling node, and closed when the first phase clock is active;
a first true sampling capacitor coupled between the first true sampling node and the first true gate;

a first true feedback capacitor coupled between a first true feedback node and the first true gate;

a first true feedback switch coupled between the complement output and the first true feedback node and closed when the second phase clock is active;

a first true sampling feedback switch coupled between the first complement input and the first true feedback node, and closed when the first phase clock is active;

a first true equalizing switch coupled between an equalizing voltage and the first true gate, and closed when a first equalizing clock derived from the first phase clock is active;

a first complement sampling switch coupled between a first true input and a first complement sampling node, and closed when the first phase clock is active;

a first complement sampling capacitor coupled between the first complement sampling node and the first complement gate;

a first complement feedback capacitor coupled between a first complement feedback node and the first complement gate;

a first complement feedback switch coupled between the true output and the first complement feedback node and closed when the second phase clock is active;

a first complement sampling feedback switch coupled between the first true input and the first complement feedback node, and closed when the first phase clock is active;

a first complement equalizing switch coupled between the equalizing voltage and the first complement gate, and closed when the first equalizing clock is active;

a second switched-capacitor network comprising:

a second true sampling switch coupled between a second complement input and a second true sampling node, and closed when the second phase clock is active;

a second true sampling capacitor coupled between the second true sampling node and the second true gate;

a second true feedback capacitor coupled between a second true feedback node and the second true gate;

a second true feedback switch coupled between the complement output and the second true feedback node and closed when the first phase clock is active;

a second true sampling feedback switch coupled between the second complement input and the second true feedback node, and closed when the second phase clock is active;

a second true equalizing switch coupled between an equalizing voltage and the second true gate, and closed when a second equalizing clock derived from the second phase clock is active;

a second complement sampling switch coupled between a second true input and a second complement sampling node, and closed when the second phase clock is active;

a second complement sampling capacitor coupled between the second complement sampling node and the second complement gate;

a second complement feedback capacitor coupled between a second complement feedback node and the second complement gate;

a second complement feedback switch coupled between the true output and the second complement feedback node and closed when the first phase clock is active;

a second complement sampling feedback switch coupled between the second true input and the second complement feedback node, and closed when the second phase clock is active; and a second complement equalizing switch coupled between the equalizing voltage and the second complement gate, and closed when the second equalizing clock is active.

14. The alternating-output op amp of claim 11 further comprising:

a common-mode voltage applied to gates of the first true trans-impedance transistor, the first complement trans-impedance transistor, the second true trans-impedance transistor, and the second complement trans-impedance transistor.

15. The alternating-output op amp of claim 11 wherein the true connection voltage is directly applied to the second-stage true node;

wherein the complement connection voltage is directly applied to the second-stage complement node, whereby current is steered from a first stage to a second stage in response to the true connection voltage and the complement connection voltage.

16. The alternating-output op amp of claim 11 wherein the true connection voltage is applied to the second-stage true node through a series filter having a resistor and a capacitor in series; and wherein the complement connection voltage is applied to the second-stage complement node through a series filter having a resistor and a capacitor in series.

17. The alternating-output op amp of claim 11 wherein the first tail transistor, the first true differential transistor, the first complement differential transistor, the second tail transistor, the second true differential transistor, and the second complement differential transistor are p-channel transistors; and wherein the first tail transistor and the second tail transistor have sources connected to a power supply.

18. The alternating-output op amp of claim 17 wherein the first true trans-impedance transistor, the first complement trans-impedance transistor, the second true trans-impedance transistor, and the second complement trans-impedance transistor are n-channel transistors; and wherein the supply node is a ground.

19. A method for amplifying two inputs using a single amplifier comprising:

generating a first phase clock and a second phase clock that are non-overlapping;

when the first phase clock is active, closing sampling switches between a first differential input and first sampling capacitors to store charge on the first sampling capacitors, and applying a fixed voltage to a backside of the first sampling capacitors and to gates of first differential transistors that are connected to the backside of the first sampling capacitors, wherein the fixed voltage is applied to the gates of the first differential transistors to equalize a first transconductance cell;

when the first phase clock is active, driving the fixed voltage onto front sides of second sampling capacitors to drive stored charge from the second sampling capacitors onto gates of second differential transistors in a second transconductance cell;

when the first phase clock is active, closing crossover switches and opening direct switches in a transconductance swap network to connect the first differential transistors in the first transconductance cell to a second stage of a trans-impedance cell, and to connect the second differential transistors in the second transconductance cell to a first stage of the trans-impedance cell;

when the first phase clock is active, generating a differential output from the trans-impedance cell by applying currents from the first transconductance cell in an equalized state to the second stage of the trans-impedance cell, and by applying currents from the second transconductance cell in an amplifying state to the first stage of the trans-impedance cell, wherein the second stage of the trans-impedance cell generates the differential output that represents a second input signal on a second differential input;

when the second phase clock is active, closing sampling switches between the second differential input and second sampling capacitors to store charge on the second sampling capacitors, and applying a fixed voltage to a backside of the second sampling capacitors and to gates of second differential transistors that are connected to the backside of the second sampling capacitors, wherein the fixed voltage is applied to the gates of the second differential transistors to equalize a second transconductance cell;

when the second phase clock is active, driving the fixed voltage onto front sides of first sampling capacitors to drive stored charge from the first sampling capacitors onto gates of first differential transistors in the first transconductance cell;

when the second phase clock is active, opening the crossover switches and closing the direct switches in the transconductance swap network to connect the first differential transistors in the first transconductance cell to the first stage of the trans-impedance cell, and to connect the second differential transistors in the second transconductance cell to the second stage of the trans-impedance cell;

when the second phase clock is active, generating the differential output from the trans-impedance cell by applying currents from the second transconductance cell in the equalized state to the second stage of the trans-impedance cell, and by applying currents from the first transconductance cell in the amplifying state to the first stage of the trans-impedance cell, wherein the second stage of the trans-impedance cell generates the differential output that represents a first input signal on the first differential input, whereby the differential output is alternately generated from the first input signal when the second phase clock is active and from the second input signal when the first phase clock is active.

20. The method for amplifying two inputs using a single amplifier of claim 19 further comprising:

when the second phase clock is active, closing first feedback switches to connect the differential output to first feedback capacitors to store first error charges;

when the first phase clock is active, opening the first feedback switches and closing first sampling feedback switches to connect the first differential input to the first feedback capacitors to apply the first error charges onto the gates of the first differential transistors;

when the first phase clock is active, closing second feedback switches to connect the differential output to second feedback capacitors to store second error charges;

when the second phase clock is active, opening the second feedback switches and closing second sampling feedback switches to connect the second differential input to the second feedback capacitors to apply the second error charges onto the gates of the second differential transistors, whereby the first error charges represent amplifier errors when the first differential input is amplified, and the second error charges represent amplifier errors when the second differential input is amplified, whereby amplifier errors are alternately compensated.

* * * * *